United States Patent [19]

Scepanovic et al.

[11] Patent Number: 5,835,378

[45] Date of Patent: Nov. 10, 1998

[54] COMPUTER IMPLEMENTED METHOD FOR LEVELING INTERCONNECT WIRING DENSITY IN A CELL PLACEMENT FOR AN INTEGRATED CIRCUIT CHIP

[75] Inventors: Ranko Scepanovic; James S. Koford, both of San Jose, Calif.; Valeriy B. Kudryavtsev, Moscow, Russian Federation; Alexander E. Andreev, Moskovskaja Oblast, Russian Federation; Stanislav V. Aleshin; Alexander S. Podkolzin, both of Moscow, Russian Federation; Douglas B. Boyle, Palo Alto, Calif.

[73] Assignee: LSI Logic Corporation, Milpitas, Calif.

[21] Appl. No.: 560,834

[22] Filed: Nov. 20, 1995

[51] Int. Cl.$^6$ .............................. G06F 9/00; G06F 11/00
[52] U.S. Cl. .............................. 364/468.28; 364/468.03; 364/468.09; 364/490
[58] Field of Search ...................... 364/488, 489, 364/490, 491, 468.03, 468.09, 468.28

[56] References Cited

U.S. PATENT DOCUMENTS

| | | | |
|---|---|---|---|
| 4,613,941 | 9/1986 | Smith et al. | 364/490 |
| 4,811,237 | 3/1989 | Putatunda et al. | 364/491 |
| 5,303,161 | 4/1994 | Burns et al. | 364/490 |
| 5,402,358 | 3/1995 | Smith et al. | 364/490 |
| 5,404,310 | 4/1995 | Mitsuhashi | 364/490 |
| 5,420,800 | 5/1995 | Fukui | 364/491 |
| 5,539,652 | 7/1996 | Tegethoff | 364/490 |
| 5,587,923 | 12/1996 | Wong | 364/490 |
| 5,619,419 | 4/1997 | D'Haeseleer et al. | 364/490 |

OTHER PUBLICATIONS

Klanhans, J., et al.; Gordian:VLSI Placement by Quadric Programming and Slicing Optimization; IEEE Trans. on CAD, 1991, pp. 356–365.

Sun, W. and Sechan, C.; "A Loosely Coupled Parallel Algorithm for Standard Cell Placement"; Proceedings of IEEE/ACM IC–CAD Conference, 1994, pp. 137–144.

*Primary Examiner*—Paul P. Gordon
*Attorney, Agent, or Firm*—Mitchell, Silberberg & Knupp LLP

[57] ABSTRACT

A digital computer includes a processor, a memory and a program which operate in combination for inputting a placement of cells for an integrated circuit chip, and a netlist of wiring nets interconnecting the cells. The placement is divided into a plurality of contiguous regions, and cell densities in the regions are computed in accordance with locations of the cells in the placement. Wiring densities in the regions are computed in accordance with the locations of the cells and the netlist. The shapes of the regions are altered to produce altered regions such that cell densities and wiring densities in the altered regions are more level or uniform. The placement is then altered such that the cells occupy locations in the altered regions which are relative to their locations in the original regions. The porosities of the cells can also be computed and used in the computation of the region shapes. The wiring densities are computed by constructing bounding boxes around the wiring nets, and computing horizontal and vertical total heights and widths of bounding boxes that overlap the regions. The altered shapes are generated by computing optimal sizes for the regions for containing the cells and required interconnect wiring, computing new lengths for edges of the regions, and iteratively recomputing new positions for corners of the regions using a mechanical mass-spring model until the system reaches equilibrium.

30 Claims, 11 Drawing Sheets

COMPUTER IMPLEMENTED METHOD FOR LEVELING INTERCONNECT WIRING DENSITY IN A CELL PLACEMENT FOR AN INTEGRATED CIRCUIT CHIP

BACKGROUND OF THE INVENTION

1. Field of the Invention

The present invention generally relates to the art of microelectronic integrated circuits, and more specifically to a computer implemented method for leveling interconnect wiring density in a cell placement for an integrated circuit chip.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including Genetic Algorithms such as simulated evolution, force directed placement or simulated annealing, and comparing the resulting placements using a cost criteria.

In conventional chip design, the positions of certain "unmovable" cells (external interconnect terminals or pads, large "megacells" etc.) will be fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

In this manner, a number of regions, which may have different sizes and shapes, are defined on the chip for placement of the rest of the cells.

It is desirable to assign individual microelectronic devices or cells to the regions, or "partition" the placement such that the total interconnect wirelength is minimized. However, methodologies for accomplishing this goal efficiently have not been proposed heretofore.

The general partitioning methodology is to hierarchically partition a large circuit into a group of smaller subcircuits until each subcircuit is small enough to be designed efficiently. Because the quality of the design may suffer due to the partitioning, the partitioning of a circuit has to be done carefully.

One of the most common objectives of partitioning is to minimize the cutsize which is defined as a number of nets crossing a cut. Also the number of partitions often appears as a constraint with upper and lower bounds. At chip level, the number of partitions is determined, in part, by the capability of the placement algorithm.

The prior art accomplishes partitioning by means of a series of "bipartitioning" problems, in which a decision is made to assign a component to one of two regions. Each component is hierarchically bipartitioned until the desired number of components is achieved.

Numerous methodologies for cell placement and assignment are known in the art. These include quadratic optimization as disclosed in an article entitled "GORDIAN: VLSI Placement by Quadratic Programming and Slicing Optimization", by J. Kleinhans et al, IEEE Trans. on CAD, 1991, pp. 356–365, and simulated annealing as described in an article entitled "A Loosely Coupled Parallel Algorithm for Standard Cell Placement", by W. Sun and C. Sechan, Proceedings of IEEE/ACM IC-CAD Conference, 1994, pp. 137–144.

Multilayer-metal submicron ASIC technologies, which produce smaller die sizes and faster circuits, come with obvious cost and performance benefits. Submicron ASICs that accommodate more than 500K gates allow a user to put an entire system onto one chip.

On the other hand, the smaller geometries that make such densities possible also make timing-delay prediction and routing within die-size constraints much more difficult. While timing tools in both the logical and physical domains exist for such ASICS, the lack of accurate rout ability models and the failure to capture or predict unroutable designs have lead to costly design iterations.

Placement and routing are traditionally two separate and independent tasks. Although almost all placement methods attempt to minimize some combination of total wire length and net crossings, the rout ability of a placement, however, cannot be truly determined until all available routers have had their chances with the chip.

Discovering that a chip is unroutable at such a late design stage is highly costly and undesirable. This phenomenon is particularly noticeable when the netlist is generated using synthesis tools.

Prior art methods do not take into account the "porosity" of cells in a placement. The porosity is the number of routing or wiring tracks that can pass through a cell. As a result, prior art methods can produce long strings of cells that resemble the "great wall of China" and/or unacceptably long individual interconnect paths can be generated which preclude the synthesis of a feasible routing pattern.

SUMMARY OF THE INVENTION

The present invention provides a computer implemented probabilistic method of leveling the wiring density in an integrated circuit cell placement, thereby producing a solution which not only has minimum total wirelength, but is also routable. The present method takes cell porosity into account in altering the cell placement to make the wiring density more level or uniform.

A digital computer implementing the present method includes a processor, a memory and a program which operate in combination for inputting a placement of cells for an integrated circuit chip, and a netlist of wiring nets interconnecting the cells.

The placement is divided into a plurality of contiguous regions, and cell densities in the regions are computed in accordance with locations of the cells in the placement. Wiring densities in the regions are computed in accordance with the locations of the cells and the netlist.

The shapes of the regions are altered to produce altered regions such that cell densities and wiring densities in the altered regions are more level or uniform. The placement is then altered such that the cells occupy locations in the altered regions which are relative to their locations in the original regions.

The porosities of the cells can also be computed and used in the computation of the region shapes.

The wiring densities are computed by constructing bounding boxes around the wiring nets, and computing horizontal and vertical total heights and widths of bounding boxes that overlap the regions.

The altered shapes are generated by computing optimal sizes for the regions for containing the cells and required interconnect wiring, computing new lengths for edges of the regions, and iteratively recomputing new positions for corners of the regions using a mechanical mass-spring model until the system reaches equilibrium.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
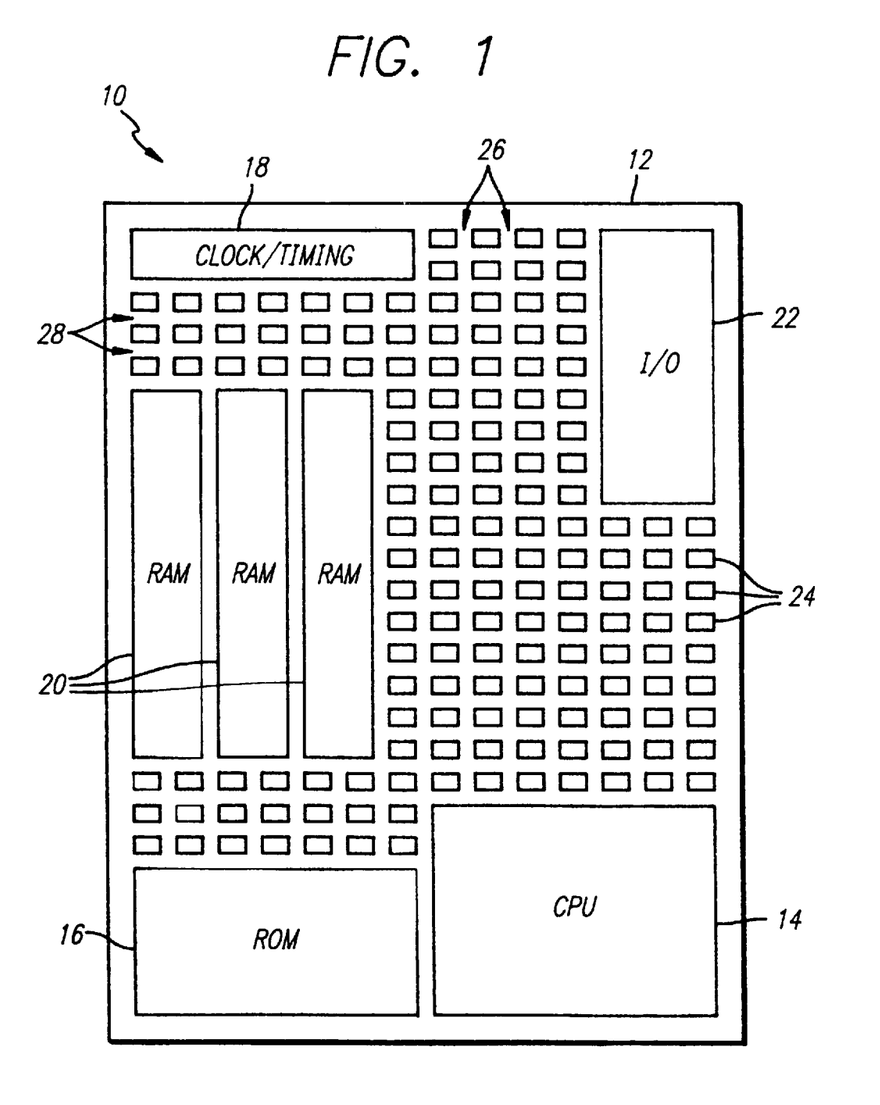
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
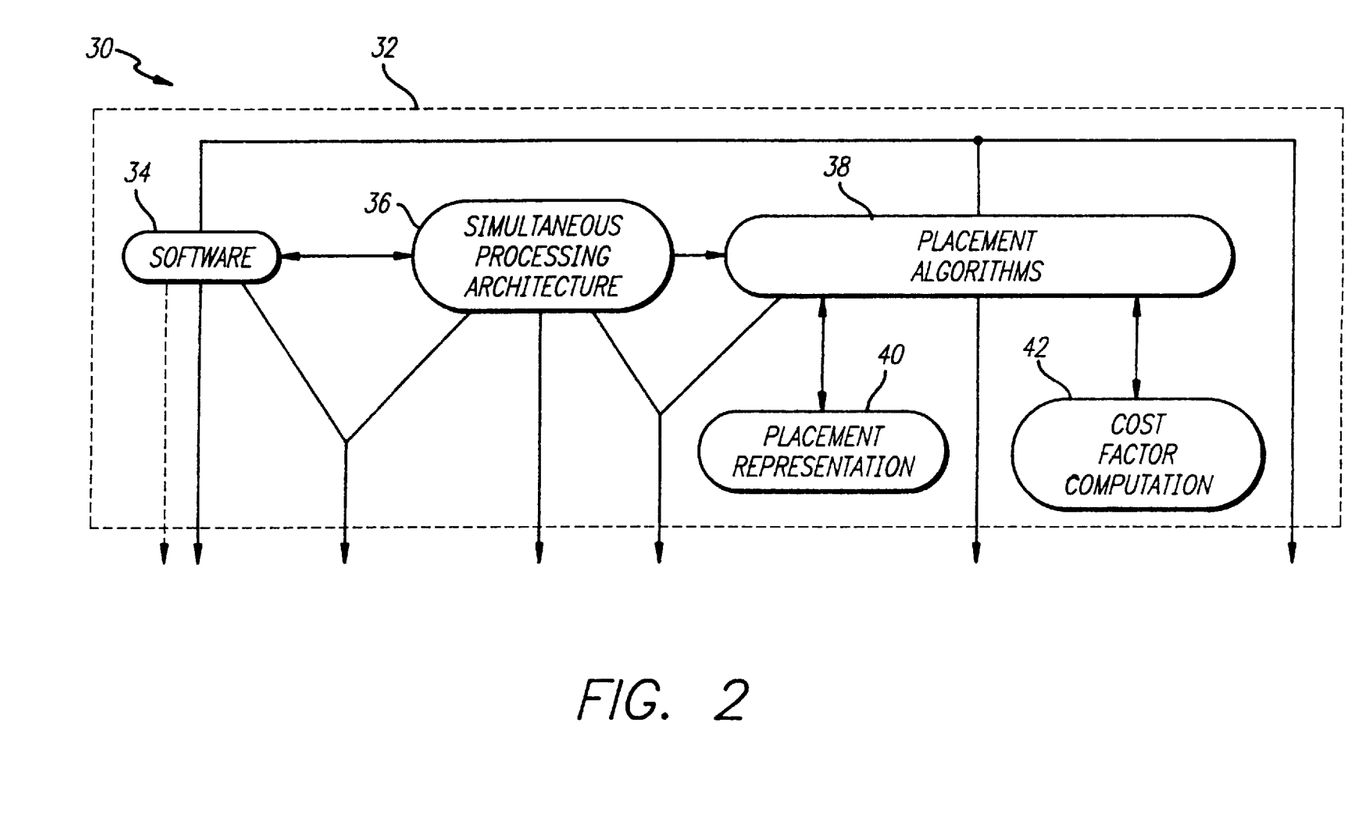
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

As will become evident from further description, system 30 is embodied as a programmed digital computer which generally comprises a processing means, memory means, and operating program which is stored in the memory means and executed by the processing means. The processing means preferably comprises a plurality of parallel processors for operating on a large number of areas of an integrated circuit cell placement concurrently.

The system 30 receives inputs for a user specified integrated circuit design including a netlist, a library of standardized microelectronic elements or cells and functional units including combinations of cells, and a set of rules that define the objectives of the design.

The architecture 36 collectively implements the required functionality of the present process by assigning different parallel processors to perform operations serially and/or concurrently, and combining the results thereof.

More specifically, the architecture 36 decomposes these functions into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or placement algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

Figure 3:
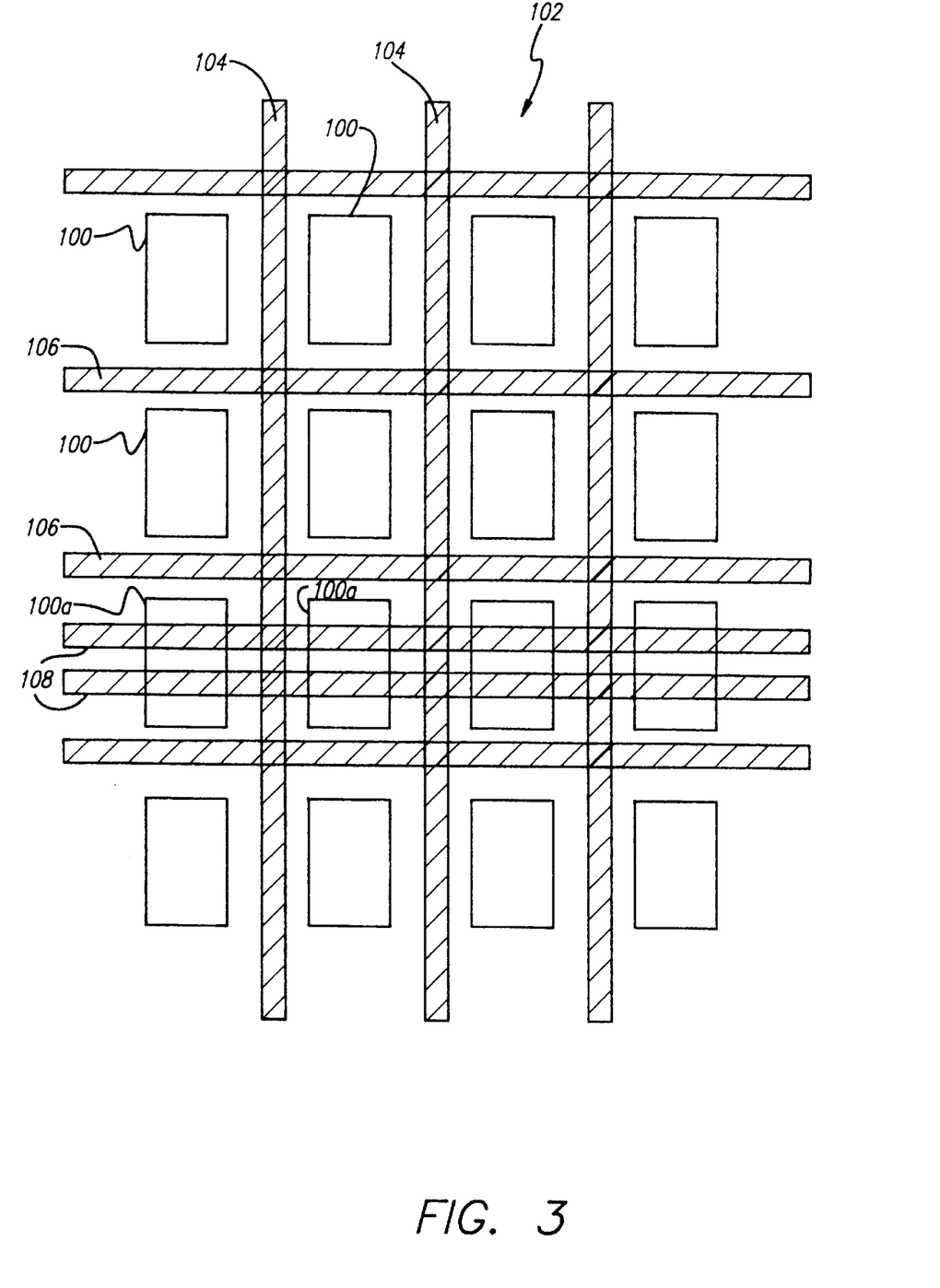
FIG. 3 is a diagram illustrating an arrangement of cells and interconnecting wiring on an integrated circuit chip.

FIG. 3 illustrates an arrangement of cells on a microelectronic integrated circuit chip. The cells can be transistors, logic gates, or any other type of small microelectronic devices.

Cells 100 are arranged in columns on an integrated circuit chip substrate 102. One or more interconnect wiring or routing tracks is provided between adjacent cells in the vertical and horizontal directions. As shown, vertical wiring 104 is routed between adjacent columns of cells 100, whereas horizontal wiring 106 is routed between adjacent rows of cells 100. The wiring 106 is provided in a different wiring plane (not illustrated) and is electrically insulated from the wiring 104.

Cells 100a are also illustrated which have "porosity". This means that one or more wiring tracks can pass through the cells 100a. In the illustrated example, the cells 100a have sufficient porosity that two horizontal wiring tracks 108 can pass therethrough.

The first step of the present method is to provide or input an initial placement of cells, and a netlist that specifies nets of interconnect wiring that interconnect the cells to provide the desired logical functionality. Each net is a list of the cells that have pins to be interconnected. A particular cell can be connected to several different nets via different pins (not shown).

Figure 4:
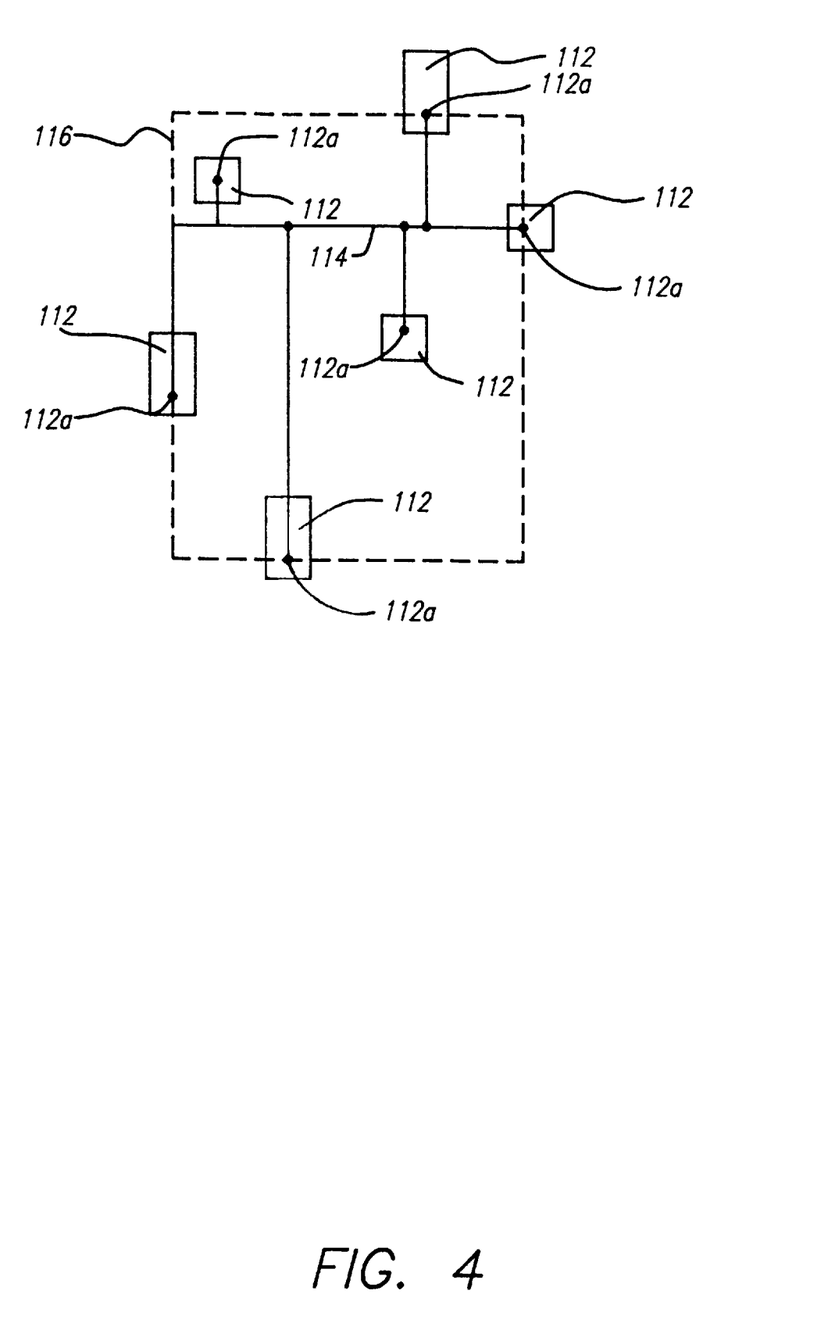
FIG. 4 is a diagram illustrating an interconnect wiring net and a bounding box constructed around the net.

FIG. 4 illustrates a net 110 consisting of cells 112 that are interconnected by wiring 114. Although the netlist does not specify any particular physical pattern for interconnecting the cells of a net, the method of the invention begins with a cell placement in combination with the netlist. Therefore, it is possible to determine the physical locations of the cells that are interconnected by a given net.

After the cells of the nets have been physically located, a "bounding box" 116 is constructed around each net 110 of the placement as shown in the drawing. The bounding box 116 delineates the periphery of outermost pins 112a of the cells 112 that are interconnected by the net 110.

Figure 5:
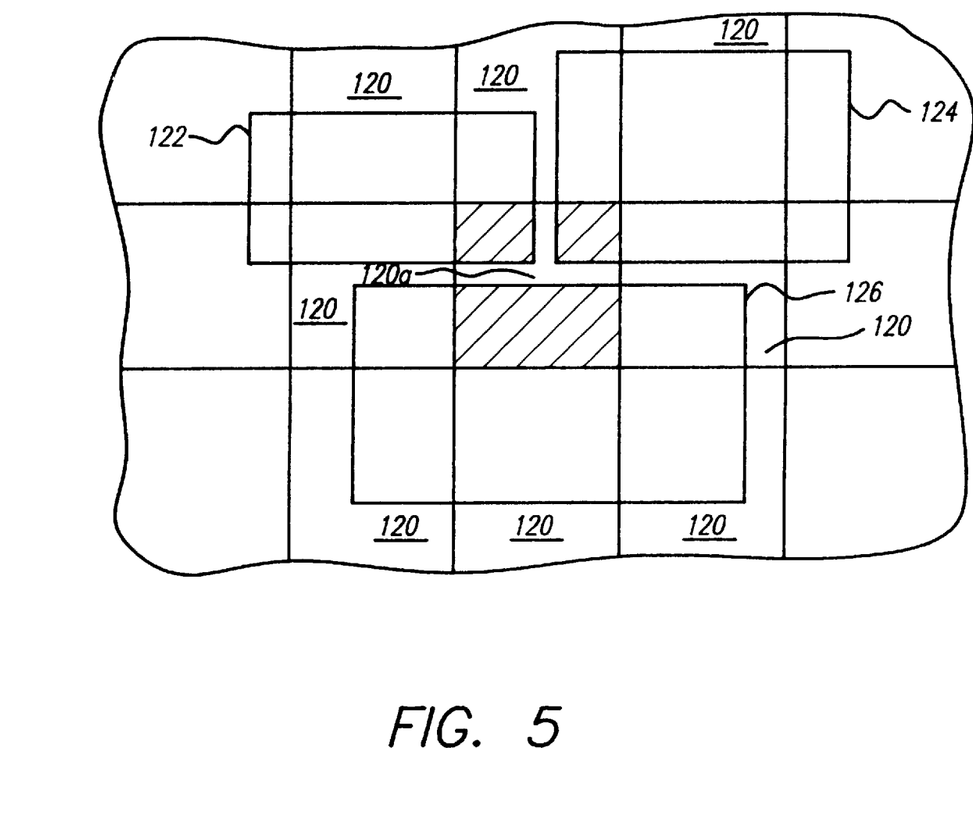
FIG. 5 is a diagram illustrating how a cell placement is divided into contiguous regions or squares, and a wiring density is computed for each square.

As illustrated in FIG. 5, the present invention then divides the entire chip, a core area of the chip, or another area of the chip in which the cell placement is to be improved into a grid of contiguous regions or "squares" 120. In the most preferred embodiment of the invention, the squares 120 are actual geometric squares having equal sides. However, the invention is not so limited, and the "squares" can have other shapes such as rectangular.

The present invention particularly relates to an integrated circuit chip arrangement in which the cells have fixed width and are arranged in columns. However, the invention is not so limited, and is applicable to other arrangements in which the cells can have different sizes and/or shapes, be arranged in rows, etc.

Assuming that the cells have the same width and are arranged in columns, the cell width is designated as $W_c$, and the estimated number of columns in the core or other placement area is N. The width w of each portion of the core allocated to one column is equal to the core width divided by the number of columns N.

The edge length of each square is k·w, where k is the number of columns to be covered by one square. The parameter k will vary depending on the variables in each particular application.

A cell density A is computed for each square as being equal to the total area of cells contained within the square. In addition, a probable routing or wiring density is computed for each square as being equal to the probability that a wire will go through a certain point in the square.

As viewed in FIG. 5, three bounding boxes 122, 124 and 126 overlap a particular square which is designated as 120a. The overlap areas are designated by hatching. It is also possible, although not explicitly shown for clarity of illustration, that two or more bounding boxes can overlap each other in a particular area of a square.

Figure 6:
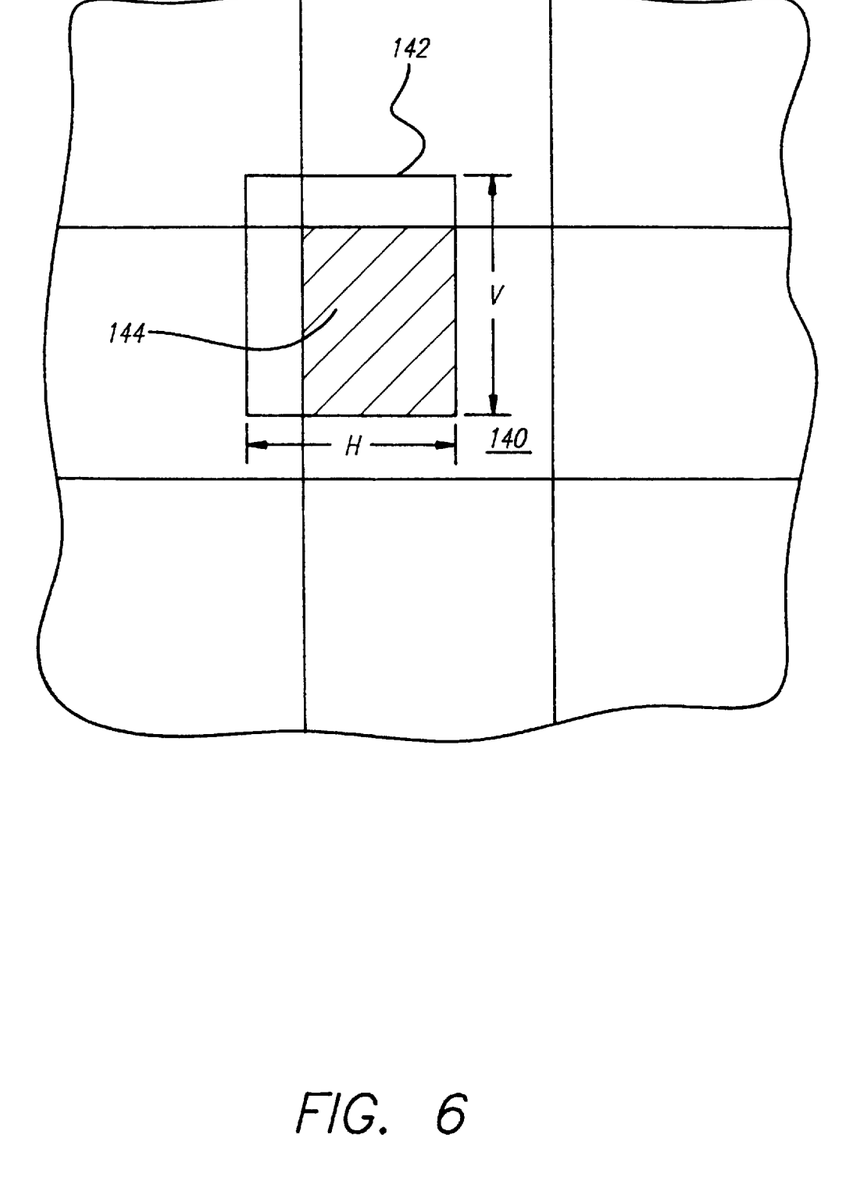
FIG. 6 is a diagram further illustrating computation of wiring density.

As illustrated in FIG. 6, a horizontal wiring density $r_h(i)$ is calculated for a square 140 and bounding box 142 as being equal to the reciprocal of a height v of the bounding box 142. This is expressed mathematically as $r_h(i)=1/v$, where i is an index for bounding boxes. Similarly, a vertical wiring density $r_v(i)$ is calculated as $r_v(i)=1/h$, where h is the width of the bounding box 142.

Alternatively, the wiring densities can be calculated using values of v and h that are equal to the height and width of an area 144 of the bounding box 142 which overlaps the square 140, with the area 144 being indicated by hatching.

It will be noted that 1/v and 1/h are dimensionless quantities which represent probabilities, and are later multiplied by dimensions to produce physical sizes as will be described in detail below.

A total horizontal wiring density $r_h$ for a given square is the sum of the values of $r_h(i)$ for all bounding boxes that overlap the square. This is expressed mathematically as $$r_h = \sum_{i=1}^{n} r_h(i)$$

where n is the number of bounding boxes, and i is an index. Similarly, a vertical wiring density $r_v$ is the sum of the values of $r_v(i)$ for all bounding boxes that overlap the square. This is expressed mathematically as $$r_v = \sum_{i=1}^{n} r_v(i)$$

It will be noted that the horizontal wiring density is calculated from the heights of the bounding boxes, and the vertical wiring density is calculated from the widths of the bounding boxes. This is because the number of wiring tracks that can pass through a bounding box in one direction is proportional to the length of the bounding box in the orthogonal direction. The probability that a wiring track will pass through a given position in a bounding box is inversely proportional to the number of possible positions.

In accordance with an important feature of the present invention, a total cell porosity P is computed for each square as being equal to the sum of the porosities of all of the cells covered by the square.

Based on the above parameters, an optimal size and shape is calculated for each square such that the square has a minimum height and width to contain the cells therein as well as the interconnect wiring corresponding to the probable wiring density.

Figure 7:
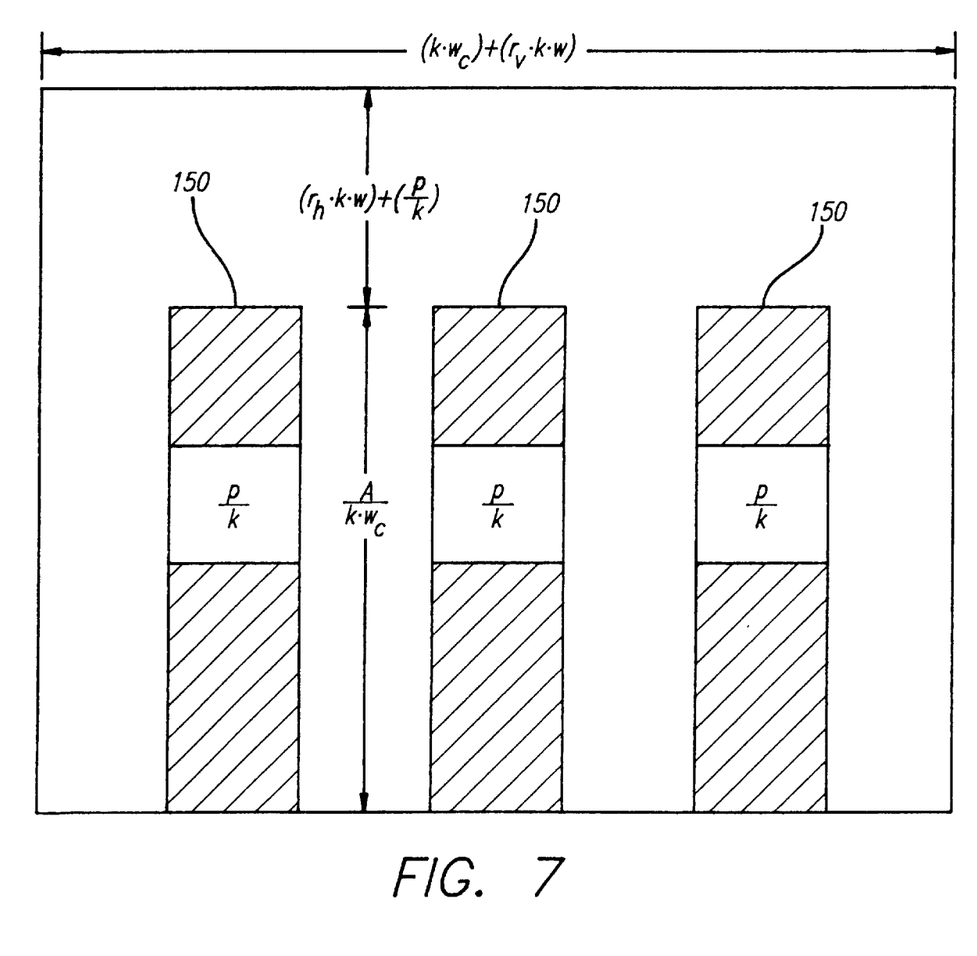
FIG. 7 is a diagram illustrating computation of an optimal size for a square.

As illustrated in FIG. 7, the sum of the heights of all cells in a square is divided by the number of columns k to produce k columns 150 of equal height $$\frac{A}{k \cdot w_c}.$$

The optimal width W for a square is given as $$W = (k \cdot w_c) + (r_v \cdot k \cdot w)$$

where $k \cdot w_c$ is the width required for the cells (column width times number of columns), and $r_v \cdot k \cdot w$ is the width required for the wiring (vertical wiring density multiplied by side of square).

The optimal height H for a square is given as $$H = \left(\frac{A}{k \cdot w_c}\right) + \left(\max 0, (r_h \cdot k \cdot w) - \left(\frac{p}{k}\right)\right)$$

where $$\left(\frac{A}{k \cdot w_c}\right)$$

is the height of each cell column (cell area divided by cell width and number of columns), and $$\max\left(0, (r_h \cdot k \cdot w) - \left(\frac{p}{k}\right)\right)$$

is the height required for the wiring.
The maximum value of 0 and $$(r_h \cdot k \cdot w) - \left(\frac{p}{k}\right)$$

is taken to prevent calculation of a negative value of $$(r_h \cdot k \cdot w) - \left(\frac{p}{k}\right)$$

in a case in which cells have very high porosity, and therefore to prevent H from becoming smaller than the minimum cell height $$\left(\frac{A}{k \cdot w_c}\right).$$

The quantity $(r_h \cdot k \cdot w)$ is the height required for the wiring (vertical wiring density multiplied by side of square). However, since the cells have porosity in the vertical direction, the optimal height of the square is reduced by the cell porosity in each column $$\left(\frac{p}{k}\right)$$

(total cell porosity divided by number of columns).

After the optimal widths and heights of the squares are computed, the sizes and shapes of the squares are altered by computing altered edge lengths for the original squares.

Figure 8:
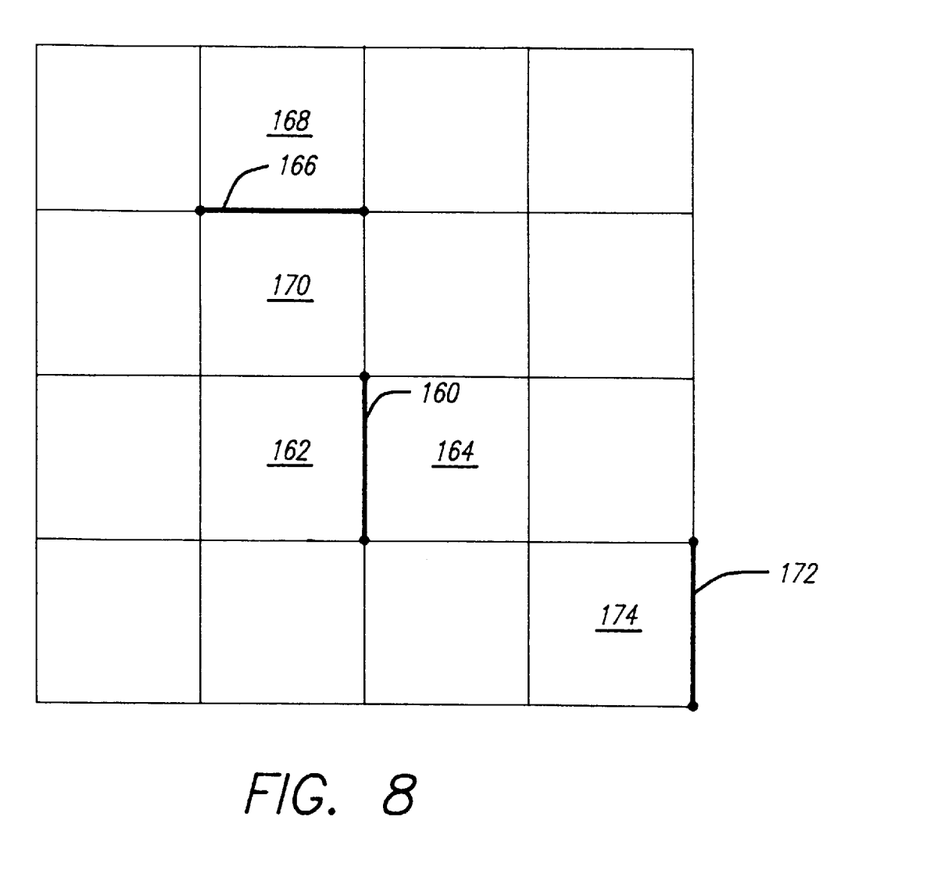
FIG. 8 is a diagram illustrating computation of altered lengths for edges of squares.

As illustrated in FIG. 8, the altered edge length of a vertical edge is calculated as the average height of the two squares that share the vertical edge. For example, the altered length of a vertical edge 160 is equal to the sum of the optimal heights H of squares 162 and 164 that share the edge 160 divided by two. Similarly, length of a horizontal edge 166 is equal to the sum of the optimal widths W of squares 168 and 170 that share the edge 166 divided by two.

The length of a vertical edge such as 172 that lies on the periphery of the core is set equal to the optimal height H of the corresponding square, in this case 174. The situation is analogous for horizontal edges on the periphery of the core.

After the altered edge lengths have been calculated for all squares, the sizes and shapes of the squares are altered to make the wiring densities more level or uniform such that ideally the densities will have the same value in each altered square.

Figure 9:
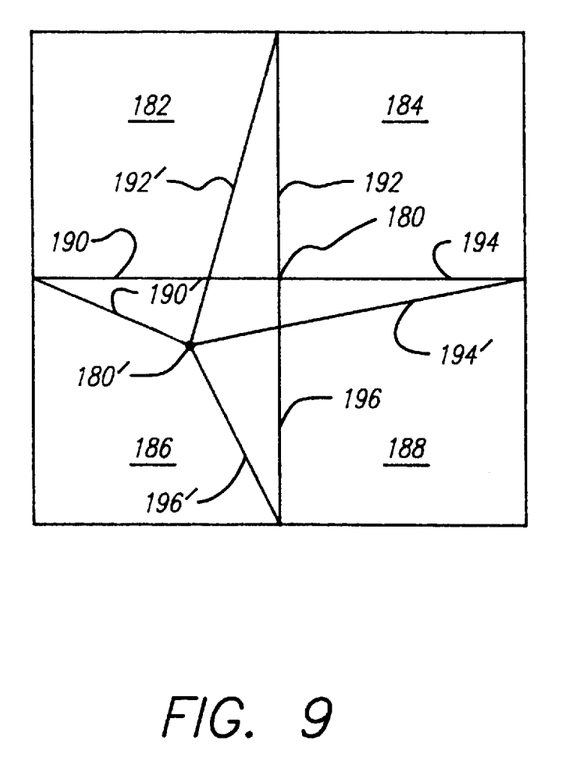
FIG. 9 is a diagram illustrating computation of a new location for a corner of four squares.

As illustrated in FIG. 9, the corners of the squares are designated as vertices or masses, and the edges of the squares are designated as lengths or springs so that the shapes of the squares can be altered using a force directed placement methodology. As shown, a corner 180 is common to four contiguous squares 182, 184, 186 and 188, and lies at the intersection of four original edges 190, 192, 194 and 196.

The edges initially have the same length. However, the altered lengths of the edges will be different.

The squares are altered by calculating new locations for the corners, and redefining the edges as extending between the new corner locations. A new location for the corner 180 is preferably calculated in rectangular coordinates. Assuming that the original lengths of the edges 190 and 194 are L1 and L2 and the altered lengths of these edges are L1' and L2', the horizontal distance of the corner 180 from the left edges of the squares 182 and 186 after relocation as indicated at 180' is $$\left(\frac{L1'}{L1' + L2'}\right) \cdot (L1 + L2).$$

The vertical location for the relocated corner 180' is calculated in an analogous manner.

As shown in the example of FIG. 9, the altered length of the edge 190 is smaller than the altered length of the edge 194, such that the corner 180' is displaced leftward of the corner 180. Similarly, the altered length of the edge 192 is longer than the altered length of the edge 196, and the corner 180' is displaced below the corner 180. The altered edges are designated by the same reference numerals as the original edges primed.

Figure 10:
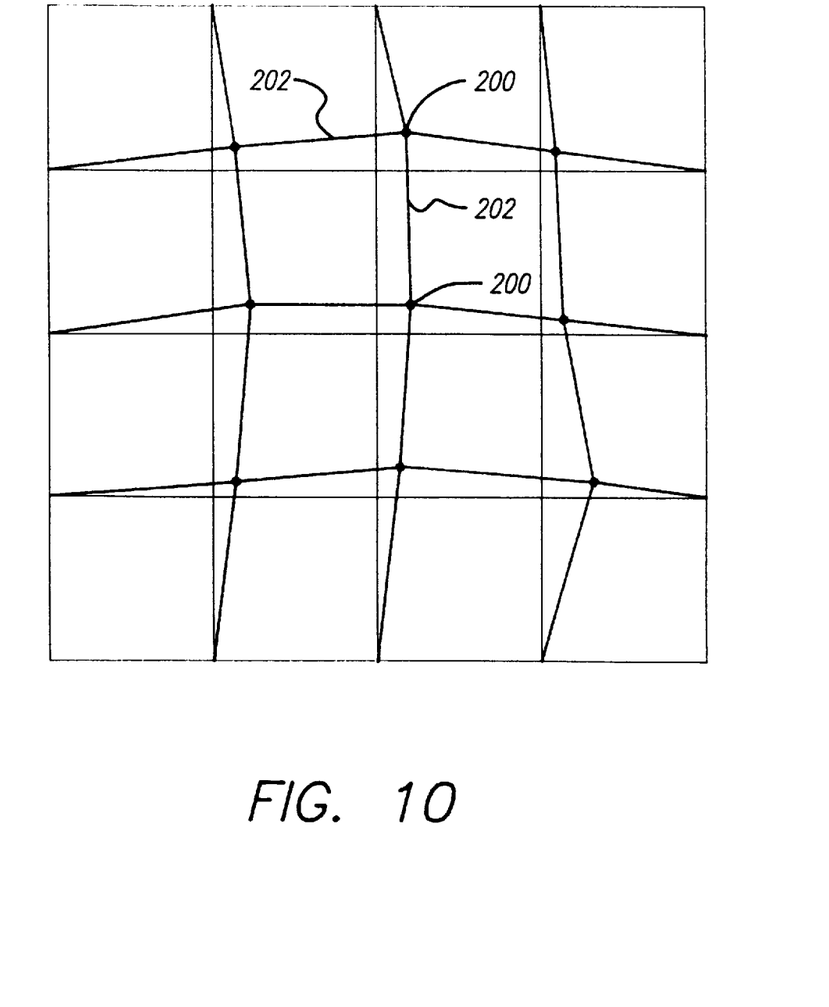
FIG. 10 is a diagram illustrating original and altered shapes for squares of a cell placement.

FIG. 10 shows an example of a grid of squares defined by corners 200 and edges 202 after their shapes have been altered as described above. Although the term "squares" will continue to be used herein, the altered squares are actually quadrilaterals which can have four edges with different lengths.

The squares are altered using the parallel processing architecture described above with reference to FIG. 2. The method is highly parallelizable because the densities, altered edge lengths, etc. for different squares can be computed simultaneously in parallel using respective processors. This enables a substantial reduction in run time compared to the prior art.

The operation described above for altering the squares is performed repeatedly in an iterative manner until an end criterion is reached. The end criterion is preferably such that a change in a predetermined cost function between two iterations is less than a predetermined value. A preferred cost function is $\Sigma$(current edge length–previous edge length)$^2$ taken over all edges.

It is further within the scope of the invention to iteratively repeat the entire process until an end criterion is reached. A suitable end criterion is reduction of total wirelength below a predetermined value, or alternatively that the change in total wirelength between two iterations is less than a predetermined value.

The operation described with reference to FIGS. 9 and 10 can be alternatively performed using a conventional force directed placement methodology, with the corners being represented by masses and the edges being represented by springs. Such a methodology produces an equilibrium configuration in which the net force in the system is zero.

The last step of the present method is to relocate the cells to locations in the altered squares that have the same relative positions as in the original squares. This is illustrated in FIGS. 11a and 11b.

Figure 11A:
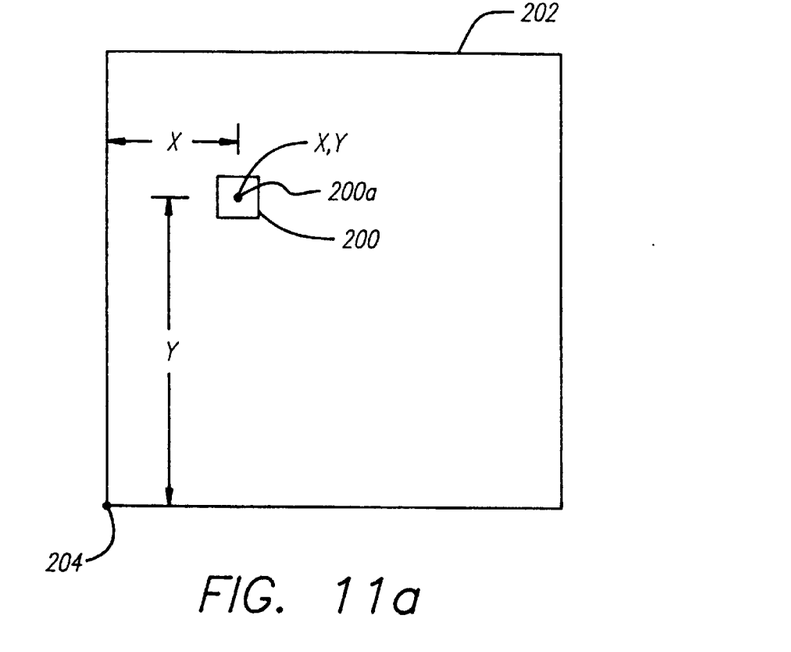
FIGS. 11a and 11b are diagrams illustrating original and altered squares and a cell located in the squares.
Figure 11B:
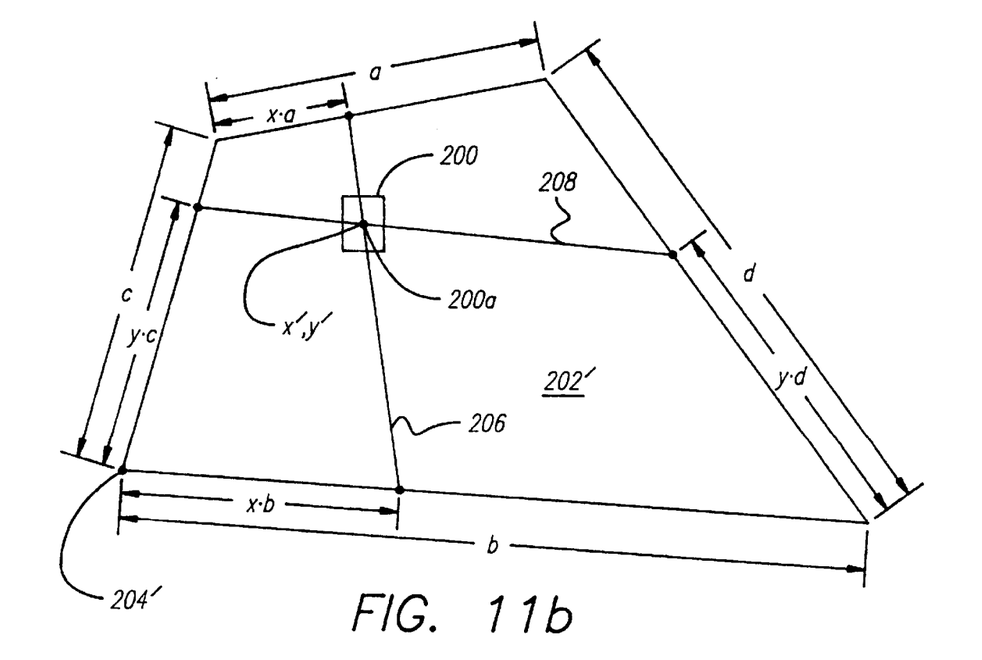

FIG. 11a illustrates a cell 200 having a center 200a which is located at horizontal and vertical coordinates (x,y) from a lower left corner 204 of an original square 202. FIG. 11b illustrates the square after its shape has been altered as described above, here designated as 202'.

The new position of the center 200a is calculated by assigning a unity value to the edges of the original square 202, such that the original coordinates x and y have values between 0 and 1. The altered lengths of the edges of the square 202' are designated as a, b, c and d.

Then, lengths (x·a), (x·b), (y·c) and (y·d) are laid out along the edges a, b, c and d respectively from the lower left corner 204'. A line 206 is laid out between the points at (x·a) and (x·b), and a line 208 is laid out between the points at (y·c) and (y·d). The coordinates (x',y') of the center 200a of the cell 200 from the corner 204' lie at the intersection of the lines 206 and 208.

In summary, the present invention provides a computer implemented method of leveling the wiring density in an integrated circuit cell placement, thereby producing a solution which not only has minimum total wirelength, but is also routable. The present method takes cell porosity into account in altering the cell placement to make the wiring density more level or uniform.

Various modifications will become possible for those skilled in the art after receiving the teachings of the present disclosure without departing from the scope thereof.

We claim:

1. A computer implemented method for leveling interconnect wiring density in a cell placement for an integrated circuit chip, comprising the steps of:

(a) providing a placement of cells on the chip, and a netlist of wiring nets interconnecting the cells;

(b) dividing the placement into a plurality of contiguous regions;

(c) computing cell densities in the regions in accordance with locations of the cells in the placement;

(d) computing wiring densities in the regions in accordance with the locations of the cells and the netlist;

(e) altering shapes of the regions to produce altered regions such that cell densities and wiring densities in the altered regions are more level than in the regions of step (c); and (f) altering the placement such that the cells occupy locations in the altered regions which are relative to their locations in the regions of step (c).

2. A method as in claim 1, in which:

step (a) further comprises specifying porosities of the cells;

the method further comprises the step, performed between steps (c) and (f), of:

(g) computing porosities of the regions in accordance with the porosities of the cells; and step (e) further comprises computing shapes for the altered regions in accordance with the cell densities of step (c), the wiring densities of step (d) and the porosities of the regions of step (g).

3. A method as in claim 2, in which step (g) comprises computing the porosities of the regions as total porosities of cells in the regions.

4. A method as in claim 1, in which step (c) comprises computing the cell densities as areas of cells in the regions.

5. A method as in claim 1, in which step (d) comprises the substeps of:

(g) constructing bounding boxes around the wiring nets respectively; and (h) computing the wiring densities as horizontal and vertical total heights and widths of bounding boxes that overlap the regions.

6. A method as in claim 1, in which step (e) comprises the substeps of:

(g) computing optimal region widths and heights in accordance with the cell densities and the wiring densities;

(h) computing horizontal and vertical region altered edge lengths in accordance with the optimal region widths and heights; and (i) computing said shapes for the altered regions in accordance with the horizontal and vertical region altered edge lengths.

7. A method as in claim 6, in which step (h) comprises the substeps of:

(j) computing the vertical region altered edge lengths as averages of optimal region heights of two contiguous regions; and (k) computing the horizontal region altered edge lengths as averages of optimal region widths of two contiguous regions.

8. A method as in claim 6, in which step (i) comprises computing said shapes using force directed placement.

9. A method as in claim 8, further comprising the step of:

(l) iteratively repeating steps (g) to (i) until an end criterion is reached.

10. A method as in claim 9, in which the end criterion is such that a change in a predetermined cost function between two iterations is less than a predetermined value.

11. A method as in claim 1, in which the regions in step (b) are squares.

12. A method as in claim 1, in which the altered regions in step (e) are quadrilaterals.

13. A method as in claim 1, in which:
   step (a) comprises providing the placement such that the cells are arranged in columns; and
   step (b) comprises dividing the placement such that each region contains a same number of columns.

14. A method as in claim 1, in which step (e) comprises computing shapes for the altered regions such that the altered regions have a substantially minimum size for containing the cells and wiring having the wiring densities computed in step (d).

15. A method as in claim 1, further comprising the step of:
   (g) iteratively performing steps (c) to (f) until an end criterion is reached.

16. A programmed digital computer for designing an integrated circuit chip, comprising:
   memory means for storing a program including instructions and data; and
   processing means for executing the program;
   the processing means, memory means and program operating in combination for performing the steps of:
      (a) inputting a placement of cells for an integrated circuit chip, and a netlist of wiring nets interconnecting the cells;
      (b) dividing the placement into a plurality of contiguous regions;
      (c) computing cell densities in the regions in accordance with locations of the cells in the placement;
      (d) computing wiring densities in the regions in accordance with the locations of the cells and the netlist;
      (e) altering shapes of the regions to produce altered regions such that cell densities and wiring densities in the altered regions are more level than in the regions of step (c); and
      (f) altering the placement such that the cells occupy locations in the altered regions which are relative to their locations in the regions of step (c).

17. A programmed digital computer as in claim 16, in which:
   step (a) further comprises specifying porosities of the cells;
   the processing means, memory means and program further operate in combination for performing the step, between steps (c) and (f), of:
      (g) computing porosities of the regions in accordance with the porosities of the cells; and
      step (e) further comprises computing shapes for the altered regions in accordance with the cell densities of step (c), the wiring densities of step (d) and the porosities of the regions of step (g).

18. A programmed digital computer as in claim 17, in which step (g) comprises computing the porosities of the regions as total porosities of cells in the regions.

19. A programmed digital computer as in claim 16, in which step (c) comprises computing the cell densities as areas of cells in the regions.

20. A programmed digital computer as in claim 16, in which step (d) comprises the substeps of:
   (g) constructing bounding boxes around the wiring nets respectively; and
   (h) computing the wiring densities as horizontal and vertical total heights and widths of bounding boxes that overlap the regions.

21. A programmed digital computer as in claim 16, in which step (e) comprises the substeps of:
   (g) computing optimal region widths and heights in accordance with the cell densities and the wiring densities;
   (h) computing horizontal and vertical region altered edge lengths in accordance with the optimal region widths and heights; and
   (i) computing said shapes for the altered regions in accordance with the horizontal and vertical region altered edge lengths.

22. A programmed digital computer as in claim 21, in which step (h) comprises the substeps of:
   (j) computing the vertical region altered edge lengths as averages of optimal region heights of two contiguous regions; and
   (k) computing the horizontal region altered edge lengths as averages of optimal region widths of two contiguous regions.

23. A programmed digital computer as in claim 21, in which step (i) comprises computing said shapes using force directed placement.

24. A programmed digital computer as in claim 22, in which the processing means, memory means and program further operate in combination for performing the step of:
   (l) iteratively repeating steps (g) to (i) until an end criterion is reached.

25. A programmed digital computer as in claim 24, in which the end criterion is such that a change in a predetermined cost function between two iterations is less than a predetermined value.

26. A programmed digital computer as in claim 16, in which the regions in step (b) are squares.

27. A programmed digital computer as in claim 16, in which the altered regions in step (e) are quadrilaterals.

28. A programmed digital computer as in claim 16, in which:
   step (a) comprises providing the placement such that the cells are arranged in columns; and
   step (b) comprises dividing the placement such that each region contains a same number of columns.

29. A programmed digital computer as in claim 16, in which step (e) comprises computing shapes for the altered regions such that the altered regions have a substantially minimum size for containing the cells and wiring having the wiring densities computed in step (d).

30. A programmed digital computer as in claim 16, in which the processing means, memory means and program further operate in combination for performing the step of:
   (g) iteratively performing steps (c) to (f) until an end criterion is reached.

* * * * *